United States Patent
Kato et al.

(10) Patent No.: US 10,186,588 B1
(45) Date of Patent: Jan. 22, 2019

(54) SEMICONDUCTOR SUBSTRATE AND SEMICONDUCTOR DEVICE

(71) Applicant: Kabushiki Kaisha Toshiba, Minato-ku (JP)

(72) Inventors: Daimotsu Kato, Kawasaki (JP); Hisashi Yoshida, Kawasaki (JP); Jumpei Tajima, Mitaka (JP); Kenjiro Uesugi, Kawasaki (JP); Toshiki Hikosaka, Kawasaki (JP); Miki Yumoto, Kawasaki (JP); Shinya Nunoue, Ichikawa (JP); Masahiko Kuraguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/899,808

(22) Filed: Feb. 20, 2018

(30) Foreign Application Priority Data

Sep. 20, 2017 (JP) .................................. 2017-180605

(51) Int. Cl.
*H01L 29/778* (2006.01)
*H01L 29/36* (2006.01)
*H01L 29/205* (2006.01)
*H01L 29/20* (2006.01)

(52) U.S. Cl.
CPC .......... *H01L 29/36* (2013.01); *H01L 29/2003* (2013.01); *H01L 29/205* (2013.01); *H01L 29/778* (2013.01)

(58) Field of Classification Search
CPC ..... H01L 29/36; H01L 29/778; H01L 29/205; H01L 29/2003
See application file for complete search history.

(56) References Cited

U.S. PATENT DOCUMENTS

| | | |
|---|---|---|
| 2011/0240962 A1 | 10/2011 | Ikuta et al. |
| 2014/0091313 A1 | 4/2014 | Kotani et al. |
| 2016/0149024 A1* | 5/2016 | Makabe ............ H01L 21/02378 257/76 |

FOREIGN PATENT DOCUMENTS

| | | |
|---|---|---|
| JP | 2012-84662 | 4/2012 |
| JP | 2014-72430 | 4/2014 |
| JP | 2015-70085 | 4/2015 |
| JP | 2015-98413 | 5/2015 |
| JP | 2016-167517 | 9/2016 |
| WO | WO 2010/070863 A1 | 6/2010 |
| WO | WO 2012/157371 A1 | 11/2012 |

OTHER PUBLICATIONS

Chunhua Zhou, et al. "Vertical Leakage/Breakdown Mechanisms in AlGaN/GaN-on-Si Devices", IEEE Electron Device Letters, vol. 33, No. 8, 2012, 3 pages.

* cited by examiner

*Primary Examiner* — David Vu
(74) *Attorney, Agent, or Firm* — Oblon, McClelland, Maier & Neustadt, L.L.P.

(57) ABSTRACT

According to one embodiment, a semiconductor substrate includes a first semiconductor layer including $Al_{x1}Ga_{1-x1}N$ ($0 < x1 \leq 1$) and including carbon and oxygen, and a second semiconductor layer including $Al_{x2}Ga_{1-x2}N$ ($0 < x2 < x1$) and including carbon and oxygen. A second ratio of a carbon concentration of the second semiconductor layer to an oxygen concentration of the second semiconductor layer is 730 or more.

20 Claims, 7 Drawing Sheets

SEMICONDUCTOR SUBSTRATE AND SEMICONDUCTOR DEVICE

CROSS-REFERENCE TO RELATED APPLICATIONS

This application is based upon and claims the benefit of priority from Japanese Patent Application No. 2017-180605, filed on Sep. 20, 2017; the entire contents of which are incorporated herein by reference.

FIELD

Embodiments described herein relate generally to a semiconductor substrate and a semiconductor device.

BACKGROUND

For example, there is a semiconductor substrate including a buffer layer of a nitride semiconductor formed on a silicon substrate. A semiconductor device is manufactured by using such a semiconductor substrate. It is desirable to increase the breakdown voltage of the semiconductor device.

DETAILED DESCRIPTION

Figure 1A:
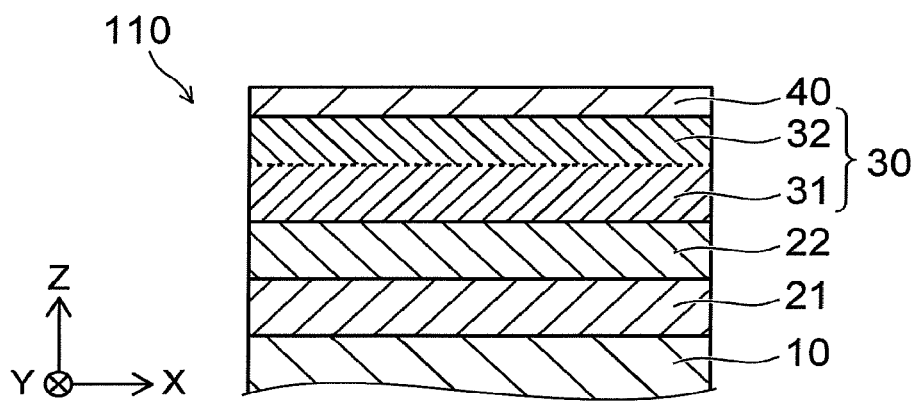
FIG. 1A and FIG. 1B are schematic cross-sectional views illustrating a semiconductor substrate according to a first embodiment.

According to one embodiment, a semiconductor substrate includes a first semiconductor layer including $Al_{x2}Ga_{1-x2}N$ ($0<x1\leq1$) and including carbon and oxygen, and a second semiconductor layer including $Al_{x2}Ga_{1-x2}N$ ($0<x2<x1$) and including carbon and oxygen. A second ratio of a carbon concentration of the second semiconductor layer to an oxygen concentration of the second semiconductor layer is 730 or more.

According to another embodiment, a semiconductor device includes a semiconductor substrate, a fourth semiconductor layer including AlGaN, a first electrode, a second electrode, and a third electrode. The semiconductor substrate includes a first semiconductor layer including $Al_{x1}Ga_{1-x1}N$ ($0<x1\leq1$) and including carbon and oxygen, and a second semiconductor layer including $Al_{x2}Ga_{1-x2}N$ ($0<x2<x1$) and including carbon and oxygen. A second ratio of a carbon concentration of the second semiconductor layer to an oxygen concentration of the second semiconductor layer is 730 or more. The second semiconductor layer is positioned between the third semiconductor layer and the first semiconductor layer. At least a portion of the third semiconductor layer is positioned between the fourth semiconductor layer and the second semiconductor layer in a first direction toward the third semiconductor layer. The third semiconductor layer includes a first partial region, a second partial region, and a third partial region. A position of the third partial region in a second direction is between a position of the first partial region in the second direction and a position of the second partial region in the second direction. The second direction crosses the first direction. The first electrode is electrically connected to the first partial region. The second electrode is electrically connected to the second partial region. The third partial region is separated from the third electrode in the first direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
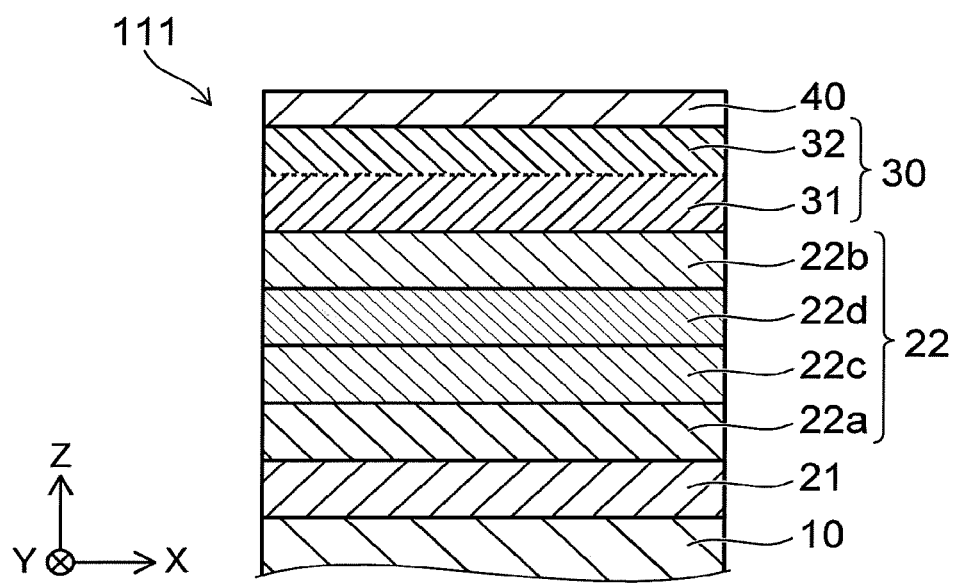

FIG. 1A and FIG. 1B are schematic cross-sectional views illustrating a semiconductor substrate according to a first embodiment.

As shown in FIG. 1A, the semiconductor substrate 110 according to the embodiment includes a first semiconductor layer 21 and a second semiconductor layer 22. A base body 10 and a third semiconductor layer 30 are provided in the example. Other semiconductor layers (e.g., a fourth semiconductor layer 40 described below, etc.) may be further provided.

The first semiconductor layer 21 includes $Al_{x1}Ga_{1-x1}N$ ($0<x1\leq1$). The first semiconductor layer 21 includes carbon and oxygen.

The second semiconductor layer 22 includes $Al_{x2}Ga_{1-x2}N$ ($0<x2<x1$). The second semiconductor layer 22 includes carbon and oxygen.

The first semiconductor layer 21 is, for example, AlN. The second semiconductor layer 22 is AlGaN.

The base body 10 is further provided in the example. The base body 10 includes, for example, silicon. The base body 10 is, for example, a silicon substrate. The first semiconductor layer 21 is positioned between the base body 10 and the second semiconductor layer 22.

The third semiconductor layer 30 includes GaN. The second semiconductor layer 22 is positioned between the third semiconductor layer 30 and the first semiconductor layer 21. A first GaN region 31 and a second GaN region 32 are provided in the example. The first GaN region 31 is positioned between the second GaN region 32 and the second semiconductor layer 22. The first GaN region includes carbon. The second GaN region 32 does not include carbon. Or, the second GaN region 32 includes carbon; and the carbon concentration of the second GaN region 32 is lower than the carbon concentration of the first GaN region 31.

For example, the first semiconductor layer 21 is formed on the base body 10. The second semiconductor layer 22 is formed on the first semiconductor layer 21. The third semiconductor layer 30 is formed on the second semiconductor layer 22.

For example, the first semiconductor layer 21 suppresses reactions between Ga and the silicon of the base body 10 (the silicon substrate).

On the other hand, the lattice constants are different between the base body 10 (the silicon substrate) and the GaN layer (the third semiconductor layer 30). The thermal expansion coefficients are different between the base body 10 (the silicon substrate) and the GaN layer. Thereby, tensile stress is generated in the GaN layer at room temperature after the growth of the GaN layer at a high temperature. Thereby, there are cases where cracks occur easily in the GaN layer.

In such a case, stress that suppresses the tensile stress can be generated by providing an appropriate second semiconductor layer 22. Thereby, the cracks can be suppressed. The second semiconductor layer 22 functions as, for example, a buffer layer.

FIG. 1B shows an example of the configuration of the second semiconductor layer 22. In a semiconductor substrate 111 as shown in FIG. 1B, the second semiconductor layer 22 includes multiple Al-containing regions (e.g., a first Al-containing region 22a, a second Al-containing region 22b, a third Al-containing region 22c, a fourth Al-containing region 22d, etc.). Otherwise, the configuration of the semiconductor substrate 111 is similar to the configuration of the semiconductor substrate 110.

The number of Al-containing regions in the semiconductor substrate 111 is four. The number may be any integer of two or more.

The first Al-containing region 22a is positioned between the second Al-containing region 22b and the first semiconductor layer 21. The third Al-containing region 22c is positioned between the second Al-containing region 22b and the first Al-containing region 22a. The fourth Al-containing region 22d is positioned between the second Al-containing region 22b and the third Al-containing region 22c.

The Al composition ratio in the second Al-containing region 22b is lower than the Al composition ratio in the first Al-containing region 22a. The Al composition ratio in the third Al-containing region 22c is between the Al composition ratio in the second Al-containing region 22b and the Al composition ratio in the first Al-containing region 22a. The Al composition ratio in the fourth Al-containing region 22d is between the Al composition ratio in the second Al-containing region 22b and the Al composition ratio in the third Al-containing region 22c.

For example, the Al composition ratio (a first Al composition ratio) in the first Al-containing region 22a is, for example, not less than 0.6 and not more than 1.0. The first Al composition ratio is, for example, about 0.67.

For example, the Al composition ratio (a second Al composition ratio) in the second Al-containing region 22b is, for example, not less than 0.0 but less than 0.2. The second Al composition ratio is, for example, about 0.13.

For example, the Al composition ratio (a third Al composition ratio) in the third Al-containing region 22c is, for example, not less than 0.4 but less than 0.6. The third Al composition ratio is, for example, about 0.54.

For example, the Al composition ratio (a fourth Al composition ratio) in the fourth Al-containing region 22d is, for example, not less than 0.2 but less than 0.4. The fourth Al composition ratio is, for example, about 0.27.

The appropriate stress is generated by such Al composition ratios; and the distortion can be suppressed.

The direction from the first semiconductor layer 21 toward the second semiconductor layer 22 is taken as a first direction (a Z-axis direction). A direction perpendicular to the Z-axis direction is taken as an X-axis direction. A direction perpendicular to the Z-axis direction and the X-axis direction is taken as a Y-axis direction. For example, the semiconductor layer spreads along the X-Y plane.

The first semiconductor layer 21 has a first lattice constant along a second direction crossing the first direction. The second semiconductor layer 22 has a second lattice constant along the second direction. The second lattice constant is larger than the first lattice constant. For example, the lattice constant along the second direction in the second Al-containing region 22b is larger than the lattice constant along the second direction in the first Al-containing region 22a. For example, the lattice constant along the second direction in the third Al-containing region 22c is between the lattice constant along the second direction in the second Al-containing region 22b and the lattice constant along the second direction in the first Al-containing region 22a. For example, the lattice constant along the second direction in the fourth Al-containing region 22d is between the lattice constant along the second direction in the second Al-containing region 22b and the lattice constant along the second direction in the third Al-containing region 22c. These lattice constants are, for example, lattice constants along the a-axis.

The appropriate stress is generated by such a relationship of the lattice constants; and the distortion can be suppressed.

As described below, the breakdown voltage can be increased by appropriately setting the characteristics relating to the carbon concentration of the second semiconductor layer 22.

An experiment relating to the breakdown voltage will now be described.

Figure 2:
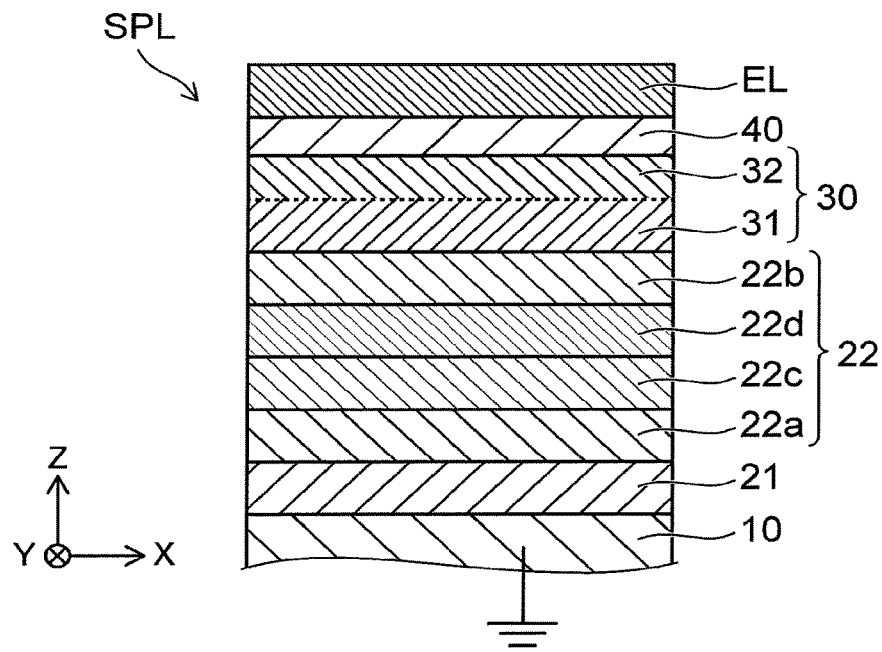
FIG. 2 is a schematic cross-sectional view illustrating an experiment sample relating to the semiconductor substrate.

FIG. 2 is a schematic cross-sectional view illustrating an experiment sample relating to the semiconductor substrate.

In the sample SPL as shown in FIG. 2, the fourth semiconductor layer 40 is provided on the third semiconductor layer 30 in the semiconductor substrate 111 described in reference to FIG. 1B. An electrode EL is provided on the fourth semiconductor layer 40. The fourth semiconductor layer 40 includes AlGaN.

In the experiment, the growth conditions of the second semiconductor layer 22 are variously modified. Thereby, the multiple samples SPL are made. The growth temperature and the gas flow rate are modified as the growth conditions. The growth of the semiconductor layer is performed by MOCVD.

For the multiple samples SPL, the voltage between the base body 10 and the electrode EL is changed; and the current that flows between the electrode EL and the base body 10 at that time is measured. The breakdown voltage is determined from the measurement results of the voltage (electric field)-current characteristic. As one index, the electric field intensity when the current density becomes $1\times10^{-4}$ A/cm$^2$ is used as the breakdown voltage.

As a result of the investigation, it was found that the breakdown voltage has a relationship with the carbon concentration of the second semiconductor layer 22. The ratio of the carbon concentration to the oxygen concentration is introduced as an index. The ratio (CC1/CO1) of the carbon concentration (CC1) of the first semiconductor layer 21 to the oxygen concentration (CO1) of the first semiconductor layer 21 is taken as a first ratio R1. The ratio (CC2/CO2) of the carbon concentration (CC2) of the second semiconductor layer 22 to the oxygen concentration (CO2) of the second semiconductor layer 22 is taken as a second ratio R2.

As described above, the Al composition ratio may change inside the second semiconductor layer 22. In such a case, the second ratio R2 is the ratio of the average carbon concentration of the second semiconductor layer 22 to the average oxygen concentration of the second semiconductor layer 22.

From the experimental results, it was found that a high breakdown voltage is obtained when the second ratio R2 is high.

Figure 3:
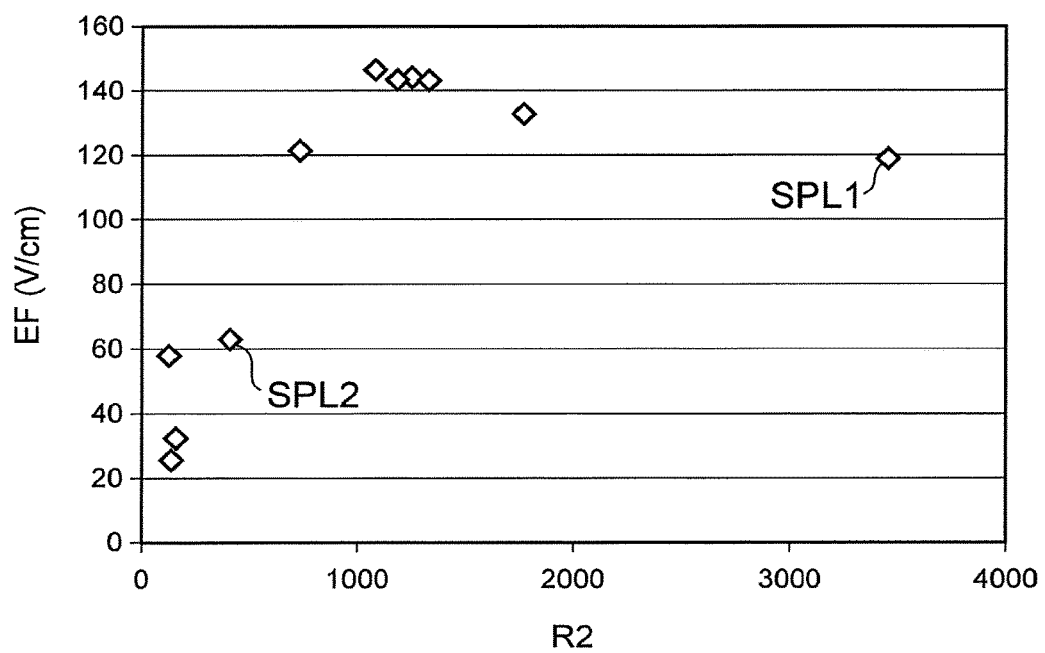
FIG. 3 is a graph illustrating the experimental results relating to the semiconductor substrate.

FIG. 3 is a graph illustrating the experimental results relating to the semiconductor substrate.

The vertical axis of FIG. 3 is the electric field intensity EF (V/cm) used as the index of the breakdown voltage. The horizontal axis is the second ratio R2.

When the second ratio R2 is low as shown in FIG. 3, the electric field intensity EF is small; and the breakdown voltage is low. The electric field intensity EF increases as the second ratio R2 increases from 100 toward 1000. There is a tendency for the increase of the electric field intensity EF to saturate when the second ratio R2 becomes 1000 or more. A practical and sufficiently high electric field intensity EF is obtained when the second ratio R2 is 730 or more. In the embodiment, it is favorable for the second ratio R2 to be 730 or more.

The second ratio R2 is about 3500 for a first sample SPL1 shown in FIG. 3. The second ratio R2 is about 400 for a second sample SPL2 shown in FIG. 3.

For the first sample SPL1 and the second sample SPL2, the first semiconductor layer 21 is AlN; and the thickness of the first semiconductor layer 21 is 350 nm. The first Al composition ratio in the first Al-containing region 22a is 0.67; and the thickness of the first Al-containing region 22a is 1 μm. The third Al composition ratio in the third Al-containing region 22c is 0.54; and the thickness of the third Al-containing region 22c is 0.5 μm. The fourth Al composition ratio in the fourth Al-containing region 22d is 0.27; and the thickness of the fourth Al-containing region 22d is 1 μm. The second Al composition ratio in the second Al-containing region 22b is 0.13; and the thickness of the second Al-containing region 22b is 1 μm. The thickness of the first GaN region 31 is 1 μm. The thickness of the second GaN region 32 is 1 μm. The fourth semiconductor layer 40 is Al$_{0.25}$Ga$_{0.75}$N; and the thickness of the fourth semiconductor layer 40 is 30 nm.

The growth temperature of the second semiconductor layer 22 for the first sample SPL1 is lower than the growth temperature of the second semiconductor layer 22 for the second sample SPL2. For the first sample SPL1 and the second sample SPL2, the growth temperature of the first GaN region 31 is lower than the growth temperature of the second GaN region 32.

The profiles of the carbon concentration and the oxygen concentration for the first sample SPL1 and the second sample SPL2 will now be described.

Figure 4:
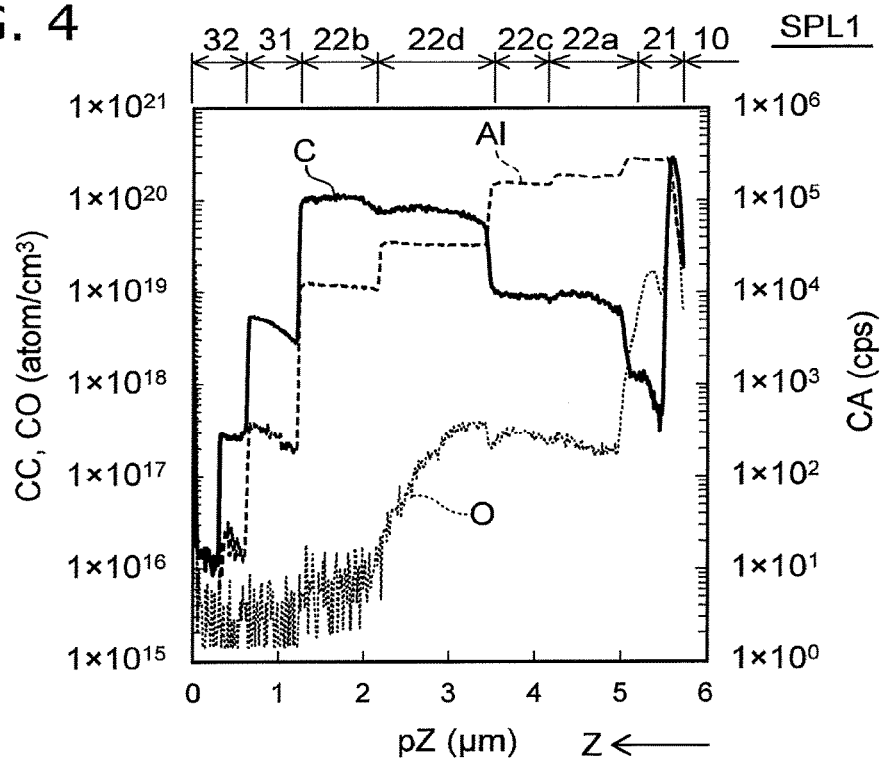
FIG. 4 is a graph illustrating a characteristic of the semiconductor substrate.
Figure 5:
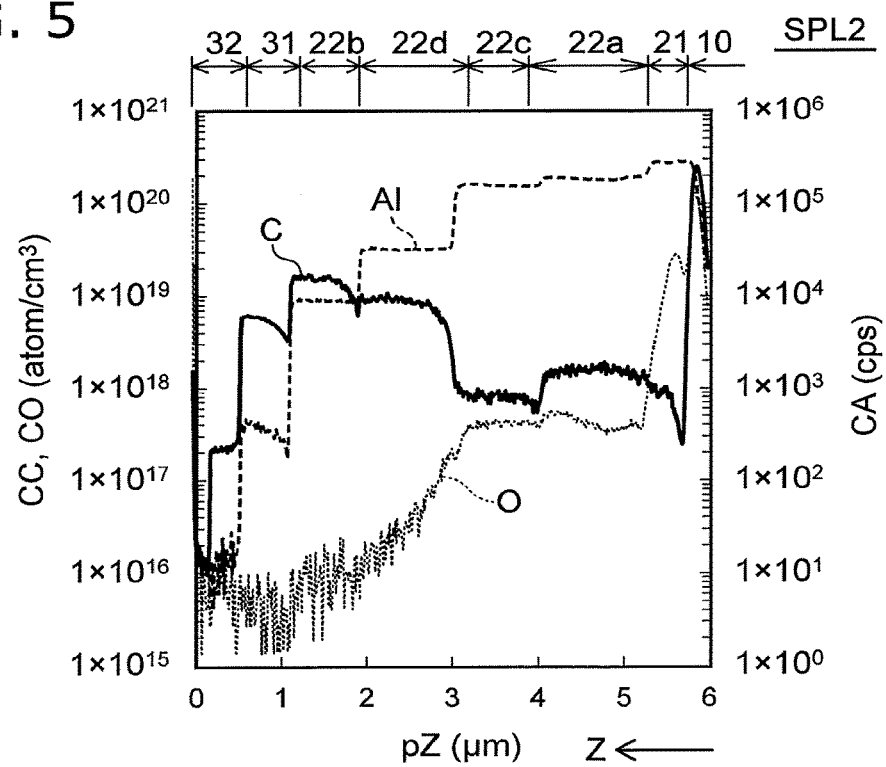
FIG. 5 is a graph illustrating a characteristic of the semiconductor substrate.

FIG. 4 and FIG. 5 are graphs illustrating a characteristic of the semiconductor substrate.

FIG. 4 corresponds to the first sample SPL1. FIG. 5 corresponds to the second sample SPL2. These figures are SIMS (Secondary Ion Mass Spectrometry) analysis results. In these figures, the horizontal axis is a position pZ (μm) in the Z-axis direction (the depth direction). The vertical axis on the left side of these figures is a carbon concentration CC (atoms/cm$^3$) or an oxygen concentration CO (atoms/cm$^3$). The vertical axis on the right side of these figures is a secondary ion intensity CA (cps) for Al.

As shown in FIG. 4, the carbon concentration CC of the second semiconductor layer 22 is high for the first sample SPL1. The carbon concentration CC of at least a portion of the second semiconductor layer 22 is $5\times10^{19}$ cm$^{-3}$ or more. For example, the carbon concentration CC of the fourth Al-containing region 22d is about $7\times10^{19}$ cm$^{-3}$. For example, the carbon concentration CC of the second Al-containing region 22b is about $1\times10^{20}$ cm$^{-3}$.

On the other hand, for the first sample SPL1, the oxygen concentration CO of the second semiconductor layer 22 is $5\times10^{17}$ cm$^{-3}$ or less. For example, the oxygen concentration CO of the fourth Al-containing region 22d is about $2\times10^{17}$ cm$^{-3}$. The carbon concentrations of the other Al-containing regions are lower than the oxygen concentration CO of the fourth Al-containing region 22d.

For the second sample SPL2 as shown in FIG. 5, the carbon concentration CC of the second semiconductor layer 22 is low compared to the first sample SPL1. The carbon concentration CC of the second semiconductor layer 22 is $1.5\times10^{19}$ cm$^{-3}$ or less. For example, the carbon concentration CC of the fourth Al-containing region 22d is about $1\times10^{19}$ cm$^{-3}$. For example, the carbon concentration CC of the second Al-containing region 22b is about $1.5\times10^{19}$ cm$^{-3}$.

On the other hand, the oxygen concentration CO of the second semiconductor layer 22 of the second sample SPL2 is substantially the same as that of the first sample SPL1.

From the comparison of FIG. 4 and FIG. 5, it is considered that the high carbon concentration CC of the second semiconductor layer 22 is related to the high electric field intensity EF (the high breakdown voltage).

It is considered that the breakdown voltage becomes low in the case where the designated carriers are included in a nitride semiconductor. For example, in the case where oxygen is included in a nitride semiconductor, the oxygen functions as a donor. For example, in the case where a nitrogen vacancy is included in the nitride semiconductor, the nitrogen vacancy functions as a donor. It is considered that the breakdown voltage decreases when the concentration of these donors becomes high. At this time, there is a tendency for the breakdown voltage to increase in the case where the nitride semiconductor includes carbon. It is considered that this is because the carbon functions as an acceptor. For example, the donors are compensated by the acceptors.

The crystallinity of a nitride semiconductor degrades in the case where the carbon concentration is excessively high in the nitride semiconductor. Therefore, generally, nitride semiconductors are formed using conditions to reduce the carbon concentration in order to obtain good crystallinity. However, the breakdown voltage is low in such a case.

In the embodiment, the carbon concentration CC is set to be high in a range in which good crystallinity is obtained. On the other hand, the carbon concentration CC of the first semiconductor layer 21 is set to be low. Thereby, for example, good crystallinity is obtained. The thickness of the first semiconductor layer 21 is thinner than the thickness of the second semiconductor layer 22. Therefore, even in the case where the carbon concentration CC of the first semiconductor layer 21 is set to be low, a practical and sufficiently high breakdown voltage is obtained.

On the other hand, the thickness of the second semiconductor layer 22 is set to be thick to generate stress to suppress the cracks. Accordingly, it is considered that the carbon concentration CC of the second semiconductor layer 22 greatly affects the breakdown voltage.

As recited above, because the oxygen functions as a donor and the carbon functions as an acceptor, it is considered that the difference (or the ratio) between the oxygen concentration and the carbon concentration affects the electrical characteristics. Practically, it is convenient to use the ratio of the carbon concentration CC to the oxygen concentration CO as a parameter.

As described in reference to FIG. 3, it was found that a high electric field intensity EF (a high breakdown voltage) is obtained stably when the second ratio R2 (C2/O2) of the second semiconductor layer 22 is 730 or more. The characteristic shown in FIG. 3 is critical.

As shown in FIG. 3, the electric field intensity EF is substantially constant when the second ratio R2 is 1000 or more. In this region, for example, it is considered that the donors are compensated sufficiently by the acceptors.

In the case where the carbon concentration CC of the second semiconductor layer 22 is excessively high, it is considered that the crystallinity degrades; and as a result, the breakdown voltage decreases. For the first sample SPL1 illustrated in FIG. 3, the second ratio R2 is about 3500; and high crystallinity can be maintained for this level.

In the fourth semiconductor layer 40 of the first sample SPL1, the screw dislocation density is $4.0 \times 10^8/cm^2$; and the edge dislocation density is $6.9 \times 10^9/cm^2$. On the other hand, in the fourth semiconductor layer 40 of the second sample SPL2, the screw dislocation density is $3.4 \times 10^8/cm^2$; and the edge dislocation density is $6.9 \times 10^9/cm^2$. Thus, the first sample SPL1 has substantially the same low dislocation density as the second sample SPL2. For the first sample SPL1, a high breakdown voltage is obtained while maintaining good crystallinity.

As described above, the first semiconductor layer 21 is thin; and the carbon concentration CC of the first semiconductor layer 21 substantially does not affect the increase of the breakdown voltage. Therefore, for the first semiconductor layer 21, it is considered that it is favorable for the carbon concentration CC to be low to obtain better crystallinity.

An example of the relationship between the second ratio R2 and the first ratio R1 will now be described.

Figure 6:
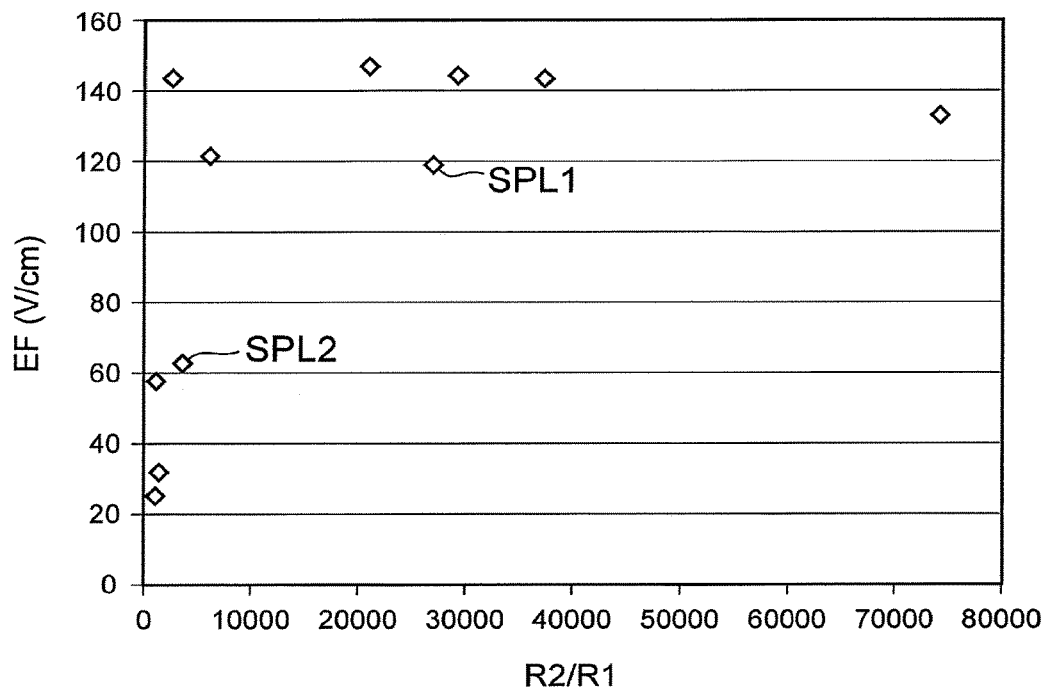
FIG. 6 is a graph illustrating a characteristic of the semiconductor substrate.

FIG. 6 is a graph illustrating a characteristic of the semiconductor substrate.

FIG. 6 illustrates the characteristic of the multiple samples described in reference to FIG. 3. The horizontal axis of FIG. 6 is a ratio R2/R1. The vertical axis of FIG. 6 is the electric field intensity EF (V/cm).

It can be seen from FIG. 6 that the electric field intensity EF is small when, for example, the ratio R2/R1 is about 5000 or less. The electric field intensity EF increases abruptly when the ratio R2/R1 becomes about 6000 or more.

In the embodiment, the second ratio R2 of the second semiconductor layer 22 is set to be high compared to the first ratio R1 of the first semiconductor layer 21. For example, the ratio (R2/R1) of the second ratio R2 to the first ratio R1 is 6170 or more. Thereby, the carbon concentration CC can be set to be low in the first semiconductor layer 21; and the carbon concentration CC can be set to be high in the second semiconductor layer 22. A high breakdown voltage and high crystallinity are obtained.

As described above, the second ratio R2 is about 3500 for the first sample SPL1; and the second ratio R2 is about 400 for the second sample SPL2. On the other hand, the first ratio R1 is 0.128 for the first sample SPL1; and the first ratio R1 is 0.113 for the second sample SPL2. The ratio R2/R1 is 27047 for the first sample SPL1; and the ratio R2/R1 is 3611 for the second sample SPL2. In the embodiment, it is favorable for the ratio R2/R1 to be 6000 or more. In the embodiment, for example, it is favorable for the ratio R2/R1 to be 6170 or more.

In the growth process of the second semiconductor layer 22, an organic substance (e.g., trimethyl aluminum, etc.) that includes aluminum is used as the source material of Al. It is considered that carbon which is an organic substance remains easily if the growth temperature is low. As described above, the growth temperature of the first sample SPL1 is lower than the growth temperature of the second sample SPL2. It is considered that the difference between the carbon concentrations CC occurs due to the growth temperature difference.

On the other hand, other than the source material of Al, a reference example may be considered in which, for example, the crystal growth is performed using a source material including carbon. In the reference example, the crystallinity degrades markedly. Therefore, in the embodiment, when performing crystal growth of AlGaN, it is favorable for the gas that is the source material of Al to be used, and for another gas including carbon not by used. In such a case, growth conditions are employed so that the carbon concentration CC is high while maintaining good crystallinity.

In such a case, it was found that it is easy to obtain the profile of the carbon concentration CC described below.

As shown in FIG. 4, the carbon concentration CC of the first Al-containing region 22a increases along the direction from the first semiconductor layer 21 toward the second semiconductor layer 22 (the Z-axis direction which is the growth direction). The carbon concentration CC of the second Al-containing region 22b increases along the direction from the first semiconductor layer 21 toward the second semiconductor layer 22. The carbon concentration CC of the fourth Al-containing region 22d increases along the direction from the first semiconductor layer 21 toward the second semiconductor layer 22.

Thus, the carbon concentration CC increases along the growth direction in the regions having constant Al composition ratios.

As shown in FIG. 4, the carbon concentration CC of the first GaN region 31 is lower than the carbon concentration CC of the second semiconductor layer 22. The carbon concentration CC of the first GaN region 31 is higher than the carbon concentration CC of the first semiconductor layer 21. The carbon concentration CC is set to be lower in the first semiconductor layer 21 than in the first GaN region 31.

As shown in FIG. 4, the carbon concentration CC of the first GaN region 31 increases along the direction from the second semiconductor layer 22 toward the third semiconductor layer 30. The crystal growth of the first GaN region 31 is performed at a relatively low temperature. For example, such a profile of the carbon concentration CC is obtained easily using such conditions.

As shown in FIG. 4, the carbon concentration CC of the second GaN region 32 is not more than the carbon concentration CC of the first semiconductor layer 21. Thus, it is favorable for the carbon concentration CC to be low on the front surface side (the position separated from the base body 10). Thereby, good characteristics are obtained for the semiconductor device manufactured using the semiconductor substrate.

In the embodiment, the first GaN region 31 may be provided as necessary. Even in the case where only the second GaN region 32 is provided without providing the first GaN region 31, a high breakdown voltage is obtained by setting the carbon concentration CC of the second semiconductor layer 22 to be high. Even in such a case, for example, a high electric field intensity EF is obtained when the second ratio R2 is 730 or more.

Second Embodiment

The embodiment relates to a semiconductor device. The semiconductor device is formed using any semiconductor substrate according to the first embodiment. The semiconductor device includes at least a portion of any semiconductor substrate according to the first embodiment.

Figure 7:
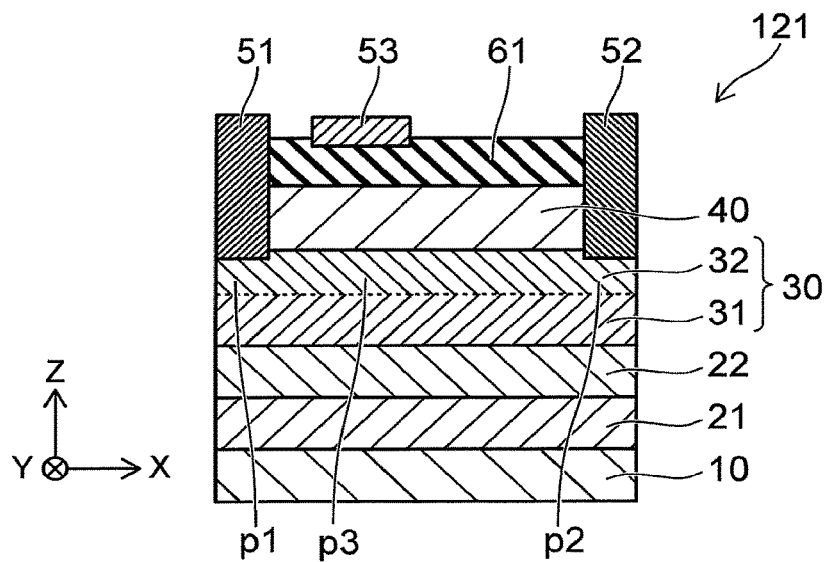
FIG. 7 is a schematic cross-sectional view illustrating the semiconductor device according to the second embodiment.

FIG. 7 is a schematic cross-sectional view illustrating the semiconductor device according to the second embodiment.

As shown in FIG. 7, the semiconductor device 121 includes the base body 10, the first semiconductor layer 21, the second semiconductor layer 22, the third semiconductor layer 30, and the fourth semiconductor layer 40. The base body 10 and the multiple semiconductor layers recited above correspond to the semiconductor substrate (the semiconductor substrate 110 (referring to FIG. 1A) or the semiconductor substrate 111 (referring to FIG. 1B)). In the case where the fourth semiconductor layer 40 is not provided in the semiconductor substrate, the fourth semiconductor layer 40 is included in the semiconductor device.

The semiconductor device 121 further includes a first electrode 51, a second electrode 52, and a third electrode 53.

At least a portion of the third semiconductor layer 30 is positioned between the fourth semiconductor layer 40 and the second semiconductor layer 22 in the first direction (the Z-axis direction) from the base body 10 toward the third semiconductor layer 30.

The third semiconductor layer 30 includes a first partial region p1, a second partial region p2, and a third partial region p3.

One direction crossing the first direction is taken as the second direction. The second direction is, for example, the X-axis direction. The position of the third partial region p3 in the second direction is between the position of the first partial region p1 in the second direction and the position of the second partial region p2 in the second direction.

The first electrode 51 is electrically connected to the first partial region p1. The second electrode 52 is electrically connected to the second partial region p2. The third partial region p3 is separated from the third electrode 53 in the first direction (the Z-axis direction).

An insulating layer 61 is further provided in the example. At least a portion of the insulating layer 61 is positioned between the third electrode 53 and the third partial region p3 in the first direction (the Z-axis direction).

The first electrode 51 functions as, for example, a source electrode. The second electrode 52 functions as, for example, a drain electrode. The third electrode 53 functions as, for example, a gate electrode. The insulating layer 61 functions as, for example, a gate insulating film. The semiconductor device 121 is, for example, a transistor. The semiconductor device 121 is, for example, a normally-on HEMT.

Figure 8:
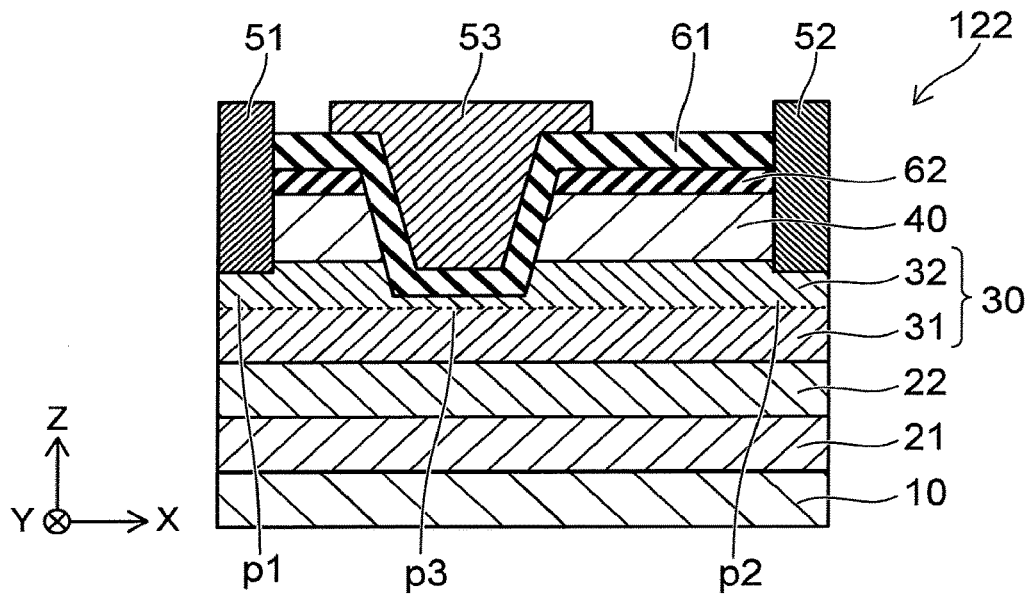
FIG. 8 is a schematic cross-sectional view illustrating another semiconductor device according to the second embodiment.

FIG. 8 is a schematic cross-sectional view illustrating another semiconductor device according to the second embodiment.

As shown in FIG. 8, an insulating portion 62 is provided in the semiconductor device 122. The third electrode 53 overlaps the fourth semiconductor layer 40 in the second direction (the X-axis direction). Otherwise, the configuration of the semiconductor device 122 is similar to the configuration of the semiconductor device 121.

The fourth semiconductor layer 40 is positioned between the insulating portion 62 and the third semiconductor layer 30 in the Z-axis direction. The insulating layer 61 overlaps the third semiconductor layer 30 in the X-axis direction. The semiconductor device 122 is, for example, a MOS HEMT.

Figure 9:
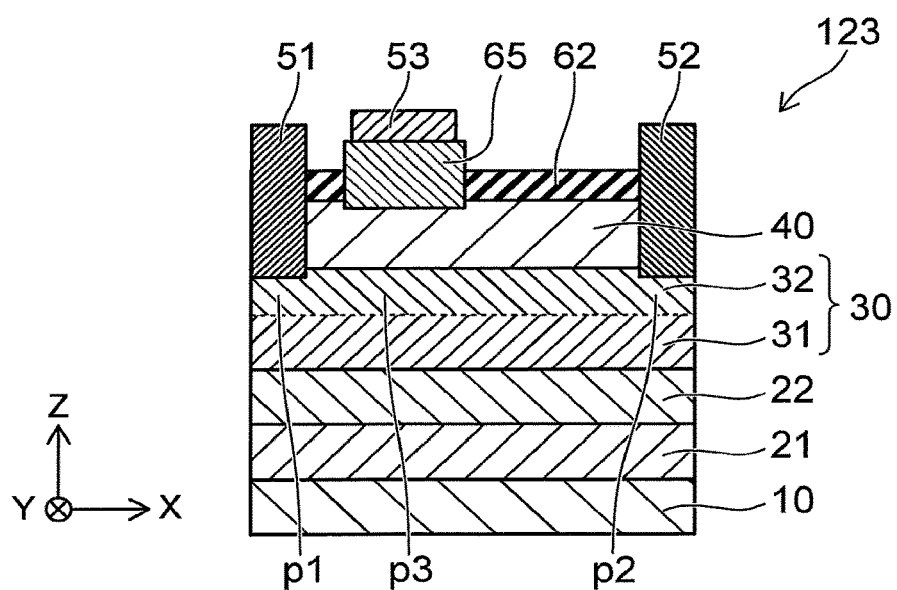
FIG. 9 is a schematic cross-sectional view illustrating another semiconductor device according to the second embodiment.

FIG. 9 is a schematic cross-sectional view illustrating another semiconductor device according to the second embodiment.

In the semiconductor device 123 as shown in FIG. 9, the insulating layer 61 is not provided; and a fifth semiconductor layer 65 is provided. The fifth semiconductor layer 65 includes p-type GaN. The insulating portion 62 also is provided. Otherwise, the configuration of the semiconductor device 123 is similar to the configuration of the semiconductor device 121.

At least a portion of the fifth semiconductor layer 65 is positioned between the third electrode 53 and the fourth semiconductor layer 40 in the first direction (the Z-axis direction). The semiconductor device 123 is, for example, a J-FET HEMT.

Figure 10:
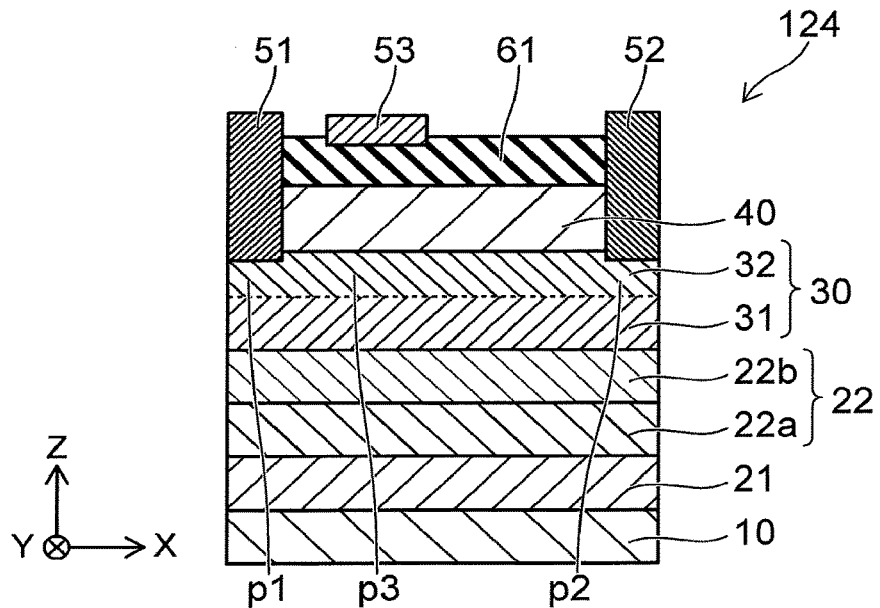
FIG. 10 is a schematic cross-sectional view illustrating another semiconductor device according to the second embodiment.

FIG. 10 is a schematic cross-sectional view illustrating another semiconductor device according to the second embodiment.

In the semiconductor device 124 as shown in FIG. 10, the second semiconductor layer 22 includes the first Al-containing region 22a and the second Al-containing region 22b. Otherwise, the configuration of the semiconductor device 124 is similar to the configuration of the semiconductor device 121.

Figure 11:
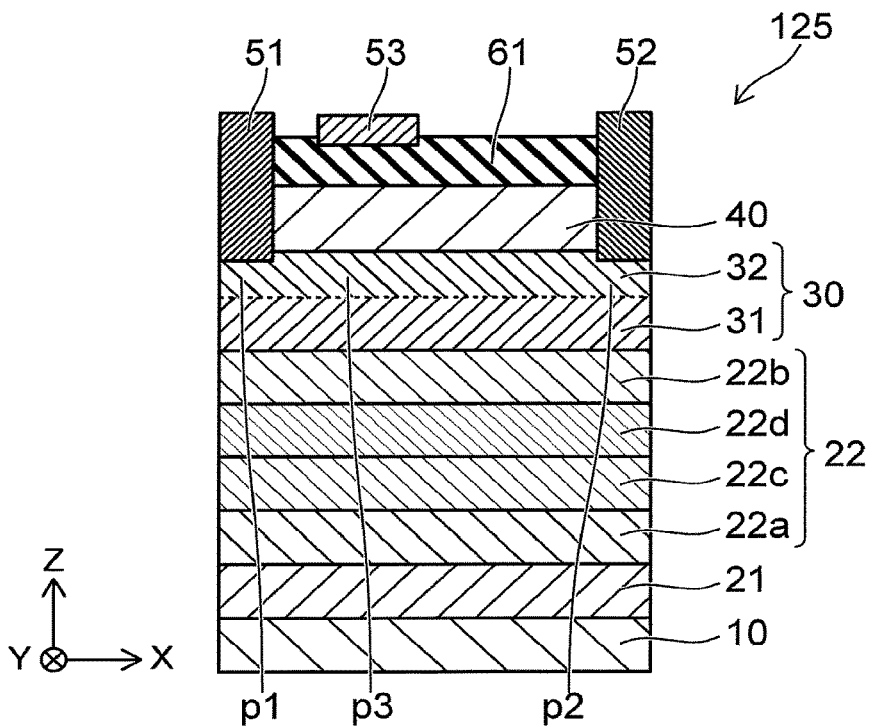
FIG. 11 is a schematic cross-sectional view illustrating another semiconductor device according to the second embodiment.

FIG. 11 is a schematic cross-sectional view illustrating another semiconductor device according to the second embodiment.

In the semiconductor device 125 as shown in FIG. 11, the second semiconductor layer 22 includes the first Al-containing region 22a, the second Al-containing region 22b, the third Al-containing region 22c, and the fourth Al-containing region 22d. Otherwise, the configuration of the semiconductor device 125 is similar to the configuration of the semiconductor device 121.

Figure 12:
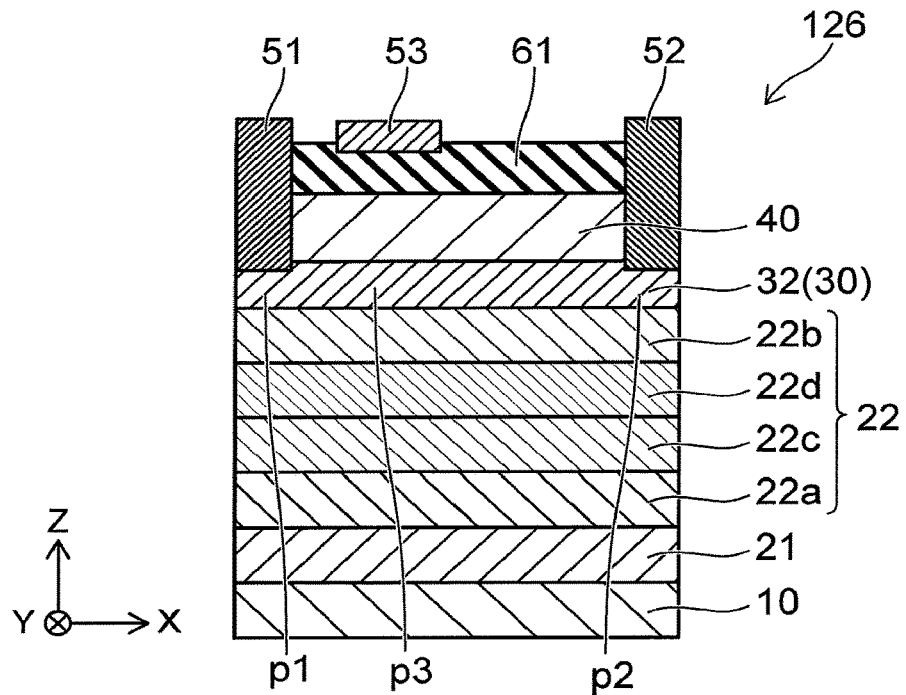
FIG. 12 is a schematic cross-sectional view illustrating another semiconductor device according to the second embodiment.

FIG. 12 is a schematic cross-sectional view illustrating another semiconductor device according to the second embodiment.

In the semiconductor device 126 as shown in FIG. 12, the first GaN region 31 is omitted; and the second GaN region 32 is provided as the third semiconductor layer 30. Otherwise, the configuration of the semiconductor device 126 is similar to the configuration of the semiconductor device 125.

A high breakdown voltage is obtained for the semiconductor devices 121 to 126.

Figure 13:
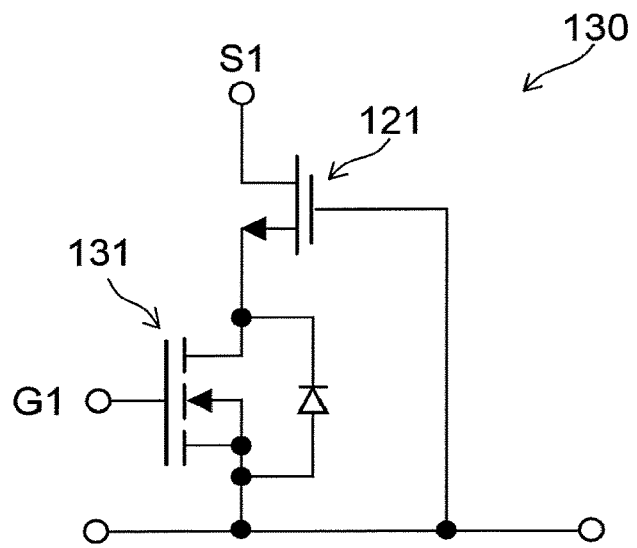
FIG. 13 is a circuit diagram illustrating another semiconductor device according to the second embodiment.

FIG. 13 is a circuit diagram illustrating another semiconductor device according to the second embodiment.

As shown in FIG. 13, the semiconductor device 130 includes the semiconductor device 131 and the semiconductor device 121 recited above. The semiconductor device 131 is a MOSFET using silicon. The semiconductor device 121 and the semiconductor device 131 have a cascode connection. For example, a normally-off operation is obtained artificially in the semiconductor device 130.

According to the embodiments, a semiconductor substrate and a semiconductor device can be provided in which the breakdown voltage can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_xIn_yAl_zGa_{1-y-z}N$ (0≤x≤1, 0≤y≤1, 0≤z≤1, and x+y+z≤1) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor substrates and semiconductor devices such as base bodies, semiconductor layers, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor substrates and semiconductor devices practicable by an appropriate design modification by one skilled in the art based on the semiconductor substrates and the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor substrate, comprising:
   a first semiconductor layer including $Al_{x1}Ga_{1-x1}N$ (0<x1≤1) and including carbon and oxygen; and
   a second semiconductor layer including $Al_{x2}Ga_{1-x2}N$ (0<x2<x1) and including carbon and oxygen,
   a second ratio of a carbon concentration of the second semiconductor layer to an oxygen concentration of the second semiconductor layer being 730 or more.

2. The substrate according to claim 1, wherein a ratio of the second ratio to a first ratio is 6000 or more, the first ratio being of a carbon concentration of the first semiconductor layer to an oxygen concentration of the first semiconductor layer.

3. The substrate according to claim 1, wherein the carbon concentration of at least a portion of the second semiconductor layer is $5×10^{19}$ cm$^{-3}$ or more.

4. The substrate according to claim 1, wherein the oxygen concentration of the second semiconductor layer is $5×10^{17}$ cm$^{-3}$ or less.

5. The substrate according to claim 1, further comprising a base body including silicon,
   the first semiconductor layer being positioned between the base body and the second semiconductor layer.

6. The substrate according to claim 1, wherein
   the second semiconductor layer includes a first Al-containing region and a second Al-containing region,
   the first Al-containing region is positioned between the second Al-containing region and the first semiconductor layer, and
   an Al composition ratio in the second Al-containing region is lower than an Al composition ratio in the first Al-containing region.

7. The substrate according to claim 6, wherein a carbon concentration of the first Al-containing region increases along a direction from the first semiconductor layer toward the second semiconductor layer.

8. The substrate according to claim 6, wherein a carbon concentration of the second Al-containing region increases along a direction from the first semiconductor layer toward the second semiconductor layer.

9. The substrate according to claim 6, wherein
   the second semiconductor layer further includes a third Al-containing region,
   the third Al-containing region is positioned between the second Al-containing region and the first Al-containing region,
   an Al composition ratio in the third Al-containing region is between the Al composition ratio in the second Al-containing region and the Al composition ratio in the first Al-containing region.

10. The substrate according to claim 9, wherein
    the second semiconductor layer further includes a fourth Al-containing region,
    the fourth Al-containing region is positioned between the second Al-containing region and the third Al-containing region,
    an Al composition ratio in the fourth Al-containing region is between the Al composition ratio in the second Al-containing region and the Al composition ratio in the third Al-containing region.

11. The substrate according to claim 1, wherein the second ratio is a ratio of an average carbon concentration of the second semiconductor layer to an average oxygen concentration of the second semiconductor layer.

12. The substrate according to claim 1, further comprising a third semiconductor layer including GaN,
    the second semiconductor layer being positioned between the third semiconductor layer and the first semiconductor layer.

13. The substrate according to claim 12, wherein
    the third semiconductor layer includes a first GaN region and a second GaN region, the first GaN region including carbon,
    the first GaN region is positioned between the second GaN region and the second semiconductor layer, the second GaN region does not include carbon, or the second GaN region includes carbon, and a carbon concentration of the second GaN region is lower than a carbon concentration of the first GaN region.

14. The substrate according to claim 13, wherein the carbon concentration of the first GaN region is lower than the carbon concentration of the second semiconductor layer.

15. The substrate according to claim 13, wherein the carbon concentration of the first GaN region is higher than the carbon concentration of the first semiconductor layer.

16. The substrate according to claim 13, wherein the carbon concentration of the first GaN region increases along a direction from the second semiconductor layer toward the third semiconductor layer.

17. The substrate according to claim 13, wherein the carbon concentration of the second GaN region is not more than the carbon concentration of the first semiconductor layer.

18. A semiconductor device, comprising:
the semiconductor substrate according to claim 12;
a fourth semiconductor layer including AlGaN;
a first electrode;
a second electrode; and
a third electrode,
the substrate further including a base body including silicon,
the first semiconductor layer being positioned between the base body and the second semiconductor layer,
at least a portion of the third semiconductor layer being positioned between the fourth semiconductor layer and the second semiconductor layer in a first direction, the first direction being from the base body toward the third semiconductor layer,
the third semiconductor layer including a first partial region, a second partial region, and a third partial region,
a position of the third partial region in a second direction being between a position of the first partial region in the second direction and a position of the second partial region in the second direction, the second direction crossing the first direction,
the first electrode being electrically connected to the first partial region,
the second electrode being electrically connected to the second partial region,
the third partial region being separated from the third electrode in the first direction.

19. The device according to claim 18, further comprising an insulating layer,
at least a portion of the insulating layer being positioned between the third electrode and the third partial region in the first direction.

20. The device according to claim 18, further comprising a fifth semiconductor layer including p-type GaN,
at least a portion of the fifth semiconductor layer being positioned between the third electrode and the fourth semiconductor layer in the first direction.

* * * * *